United States Patent
Czerkas

(10) Patent No.: US 7,826,068 B2
(45) Date of Patent: Nov. 2, 2010

(54) METHOD FOR CORRECTING MEASURED VALUES RESULTING FROM THE BENDING OF A SUBSTRATE

(75) Inventor: Slawomir Czerkas, Weilburg (DE)

(73) Assignee: Vistec Semiconductor Systems GmbH, Weilburg (DE)

(*) Notice: Subject to any disclaimer, the term of this patent is extended or adjusted under 35 U.S.C. 154(b) by 361 days.

(21) Appl. No.: 12/147,974

(22) Filed: Jun. 27, 2008

(65) Prior Publication Data

US 2009/0030639 A1    Jan. 29, 2009

(30) Foreign Application Priority Data

Jul. 26, 2007   (DE) ................. 10 2007 035 519

(51) Int. Cl.
*G01B 11/24* (2006.01)

(52) U.S. Cl. .................... 356/601; 356/237.2

(58) Field of Classification Search ................ 356/601, 356/500, 237.2–237.5, 339–401, 625, 614; 702/94–95, 85; 33/533, 613, 645, 568, 573, 33/1 M; 430/5, 30; 451/6, 8; 250/221, 227.24, 250/227.11, 227.14, 492, 492.2

See application file for complete search history.

(56) References Cited

U.S. PATENT DOCUMENTS

| | | | |
|---|---|---|---|
| 6,347,458 | B1 | 2/2002 | Kaczynski |
| 6,377,870 | B1 | 4/2002 | Blaesing-Bangert et al. |
| 6,960,755 | B2 | 11/2005 | Kaczynski |
| 2005/0254068 | A1 | 11/2005 | Rinn et al. |
| 2007/0103659 | A1 | 5/2007 | Yoshitake et al. |

OTHER PUBLICATIONS

Blaesing, C., "Pattern Placement Metrology for Mask Making," SEMI, Mar. 31, 1998.

*Primary Examiner*—Gregory J Toatley
*Assistant Examiner*—Tri T Ton
(74) *Attorney, Agent, or Firm*—Houston Eliseeva, LLP

(57) ABSTRACT

A method for correcting the measured values of positions of structures (3) on a substrate (2) resulting from bending of a substrate (2) is disclosed. A plurality of geometric parameters of the substrate (2) are determined. A plurality of physical parameters of the substrate (2) are determined. A degree of bending is calculated individually for each substrate (2) on the basis of the obtained geometric parameters, the physical parameters and the position of the support points (40). The measured position data of the structures (3) on the substrate (2) is corrected with the aid of each individually calculated degree of bending.

13 Claims, 5 Drawing Sheets

US 7,826,068 B2

METHOD FOR CORRECTING MEASURED VALUES RESULTING FROM THE BENDING OF A SUBSTRATE

RELATED APPLICATIONS

This application claims priority to German Patent Application No. DE 10 2007 035 519.1, filed on Jul. 26, 2007, which is incorporated herein by reference in its entirety.

FIELD OF THE INVENTION

The present invention relates to a method for correcting measured values resulting from the bending of a substrate.

BACKGROUND OF THE INVENTION

A measuring apparatus as used for measuring structures on wafers and masks used for their manufacture has been disclosed in the paper entitled "Pattern Placement Metrology for Mask Making" by Dr. Carola Bläsing. The paper was held at the Semicon Education Program Convention in Geneva on Mar. 31, 1998. The description given there is the basis for a coordinate measuring apparatus, of which various models are already commercially available.

An apparatus of the generic type is also disclosed, for example, in DE 199 49 005, DE 198 58 428, DE 101 06 699 or DE 10 2004 023 739. All the here cited documents of the state of the art, disclose a coordinate measuring apparatus for measuring structures or positions of structures on a substrate. Herein the substrate is placed on a stage moveable in the X coordinate direction and Y coordinate direction. The substrate to be measured is usually placed in a substrate support and exhibits a certain degree of bending. It is this degree of bending which must be calculated out, or the measured values must be corrected by a previously determined bending value for determination of the position or the structural width.

In order to calculate the bending of a mask or substrate, a great number of parameters first have to be known. The bending is dependent, for example, on the position of the support points of the substrate on the measuring stage or substrate support. A further influence on bending or on the calculation of bending originates from the mask size, the mask thickness, the position of the mask or the angular displacement of the mask in relation to the coordinate system of the measuring machine. For calculation of the degree of bending, it is assumed that the individual substrates are always placed on the measuring stage or on the substrate support in the same way. Additionally, the same values for mask size and mask thickness are always indicated, as, for example, those supplied by the manufacturer of the masks. Similarly, a constant (preset) modulus of elasticity is assumed for the calculation of the degree of bending. This modulus of elasticity is a material constant, which can also be supplied by the manufacturer of the mask. Deviations from the aforementioned values or parameters result in calculation of a degree of bending which does not correspond to the actual bending. Thus, for example, an error of 100 MPA in the modulus of elasticity results in an error of typically about one nanometer in the measured lateral structural position. This is, for example, the tolerance with which the mask is supplied. It is therefore of particular advantage, for example, to measure the modulus of elasticity of the currently inserted mask to enhance the accuracy of position determination of structures on a mask. Other parameters to be incorporated in the calculation of bending of the mask should also be determined individually for each mask, resulting in the enhancement of measuring accuracy.

SUMMARY OF THE INVENTION

It is therefore an object of the present invention to provide a method to calculate the degree of bending of each mask to be measured and to determine correction values for the position of structures on the mask on the basis of this bending.

The above object is solved by a method comprising the steps of:
determining at least one geometric parameter of the substrate.
determining at least one physical parameter of the substrate and at least one environmental parameter;
determining the geometry and a plane defined by support points and obtaining a position of each support point in relation to a coordinate system of the substrate;
individually calculating a degree of bending for each substrate on the basis of the determined geometric parameters, the physical parameters and the positions of the support points; and
correcting the measured position data of the structures on the substrate with the aid of the individually calculated degree of bending.

Advantageously the method can be used to correct measured values, such as the position of structures on a mask or the width of structures, which would otherwise lead to a different measured value due to bending of the substrate. In order to correct a plurality of measurements of structural positions on one substrate, a plurality of geometric parameters of the substrate first have to be determined. A number of physical parameters of the substrate and environmental parameters are also determined. The substrate can be supported in any desired way, typically the substrate is supported on three support points, so that the geometry and the plane defined by the support points have to be determined. The position of the support points in relation to the coordinate system of the substrate also has to be established. The degree of bending to be expected is calculated individually for each substrate on the basis of the determined geometrical parameters, the physical parameters, the environmental parameters and the position of the support points. Finally the measured position data of the structures on the substrate are corrected on the basis of the individually calculated degree of bending of the substrate.

The local thickness of the substrate is determined by means of establishing both the plane defined by the support points and the position of the surface of the substrate supported on the support points. The local thickness of the substrate can then be calculated from the distance between the plane and the surface.

The geometric parameters comprise the local thickness and the contour of the substrate.

The physical parameters comprise the modulus of elasticity and the density. The environmental parameters comprise the acceleration due to gravity at each respective installation location of the coordinate measuring machine, the air pressure, the humidity and the temperature. The substrate comprises a plurality of outer edges, wherein the size and the contour of the substrate is calculated on the basis of the position of the edges relative to a coordinate system determined by the support points. The position of the substrate can thus be determined relative to the coordinate system of the support points.

The modulus of elasticity of the substrate used can be determined from the calculated and measured degree of bending and from the resulting deviation of the lateral positions of the substrate being used. The deviation of the calculated parameters from the parameter used for calculating a reference substrate can also be determined The degree of bending of the reference substrate is calculated using reference parameters. The reference parameters are selected in such a way that they each fluctuate within a predefined range of tolerance. A discrete parameter is selected from each tolerance range, and on the basis of the selected parameters calculation of the degree of bending of the substrate is carried out with any combination of selected parameters. An interpolation can also be carried out between the calculated values.

The calculation of the actual degree of bending of the substrate can also be carried out for each set of parameters measured. The substrate can be a mask for semiconductor manufacture.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
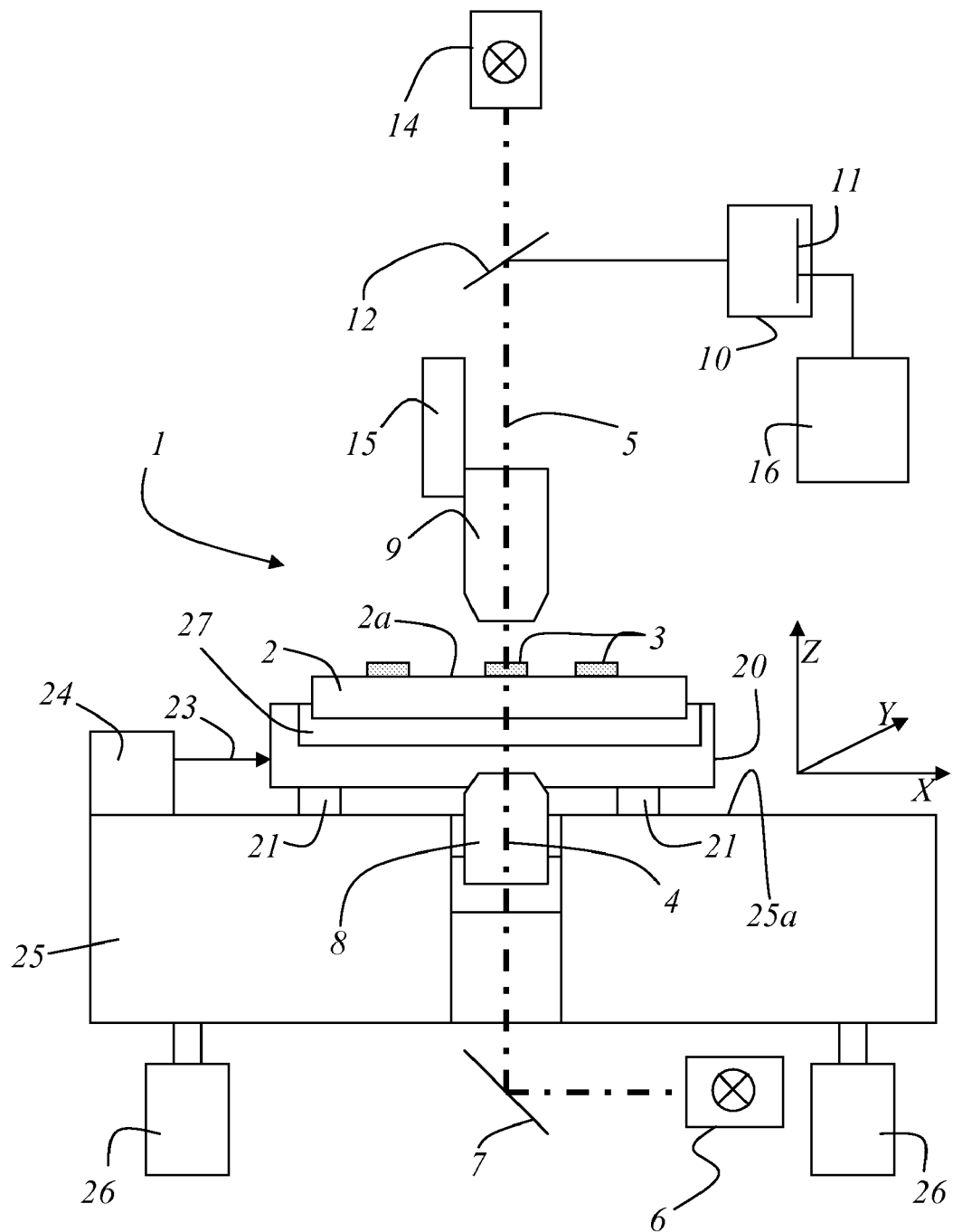
FIG. 1 schematically shows a coordinate measuring apparatus, in which the method according to the present invention can be carried out.

FIG. 1 is a schematic view of a coordinate measuring machine 1, in which the method according to the present invention can be used. For this purpose a substrate 2 with structures 3 arranged on a surface 2a, is inserted in a substrate holder 27 which is in turn positioned on a measuring stage 20. Measuring stage 20 supported on air bearings 21 is traversable in one plane. Plane 25a is defined by an element 25 in this case. Element 25, in the embodiment shown here, is manufactured of granite. Element 25 is mounted in a vibration-damped manner. While substrate 2 is placed in a substrate holder 27 in the embodiment shown here, it will be understood, however, by a person skilled in the art that substrate 2 can also be directly inserted in measuring stage 20 without a substrate holder. Measuring stage 20 supported on air bearings 21 is traversable in plane 25a. Plane 25a is essentially defined by the X coordinate direction and Y coordinate direction. The position of measuring stage 20 is determined by at least one laser interferometer 24 which emits a measuring light beam 23.

For the illumination of substrate 2, a transmitted-light illumination means 6 is provided, which emits light in a transmitted-light illumination beam path 4. The light from transmitted-light illumination means 6 is passed via a reflecting mirror 7 to the transmitted-light illumination beam path. A condenser 8 images the light onto substrate 2. An incident-light illumination means 14 is also provided, which emits light in an incident-light illumination beam path 5. The illumination light is directed onto substrate 2 via measuring lens 9 which is arranged moveable in the Z coordinate direction by means 15. Both the transmitted-light illumination light and the incident-light illumination light are collected by measuring lens 9 and passed via a semitransparent mirror 12 to a camera 10 comprising a detector 11. Detector 11 is connected to computer 16 for producing a digital image from the signals detected by detector 11.

Figure 2:
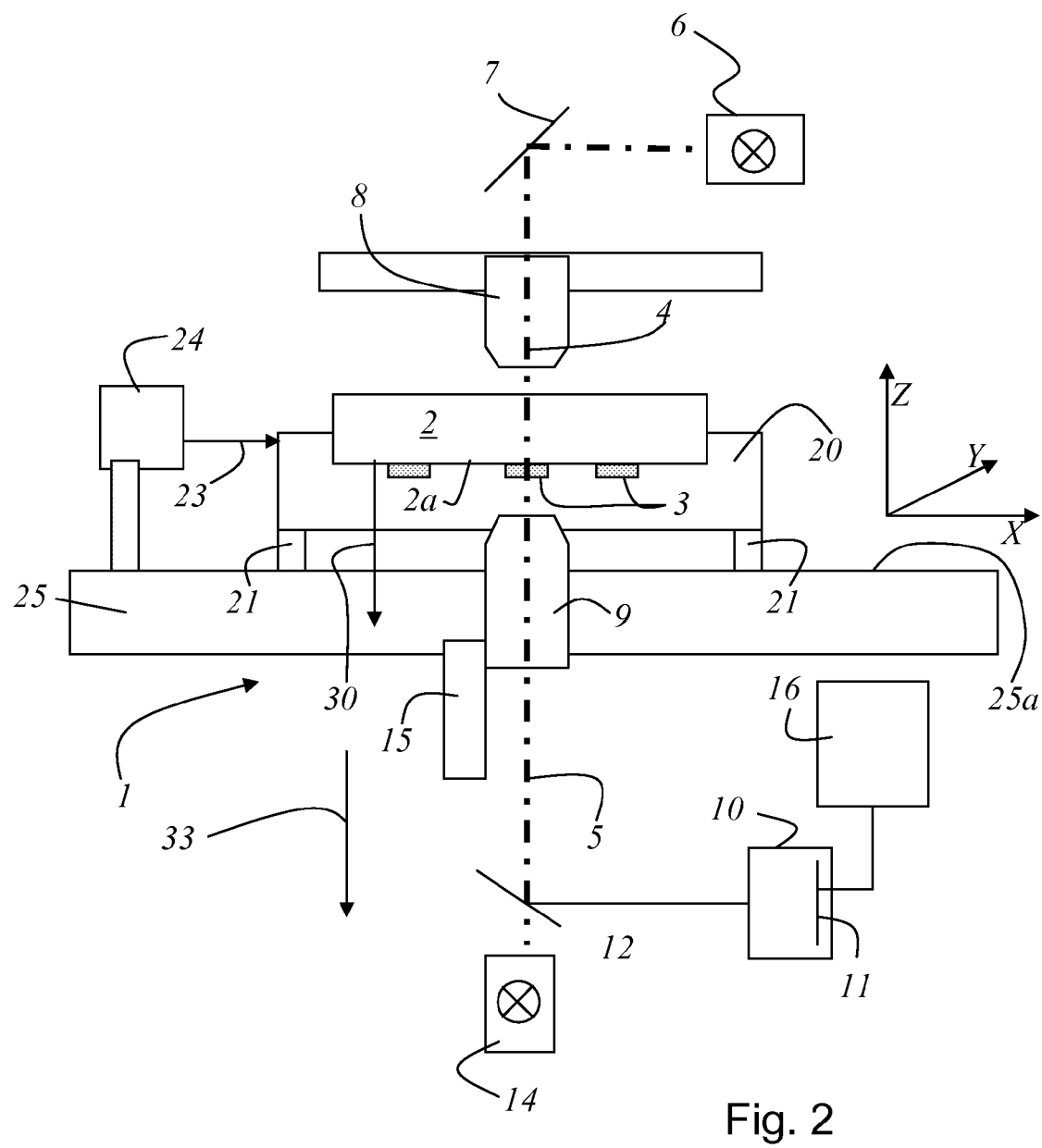
FIG. 2 schematically shows another exemplary embodiment of a coordinate measuring apparatus in which the method according to the present invention can also be carried out.

FIG. 2 shows a further exemplary embodiment of a coordinate measuring machine 1, in which the method according to the present invention can be carried out. The same reference numerals indicate the same elements throughout FIGS. 1 and 2. The difference to the exemplary embodiment of coordinate measuring machine 1 depicted in FIG. 1, is that substrate 2 is placed in measuring stage 20 in such a way that structures 3 on surface 2a of the substrate face in the direction of the force of gravity 33. Surface 2a of substrate 2 has a normal vector 30 which is essentially parallel to the force of gravity 33.

Figure 3:
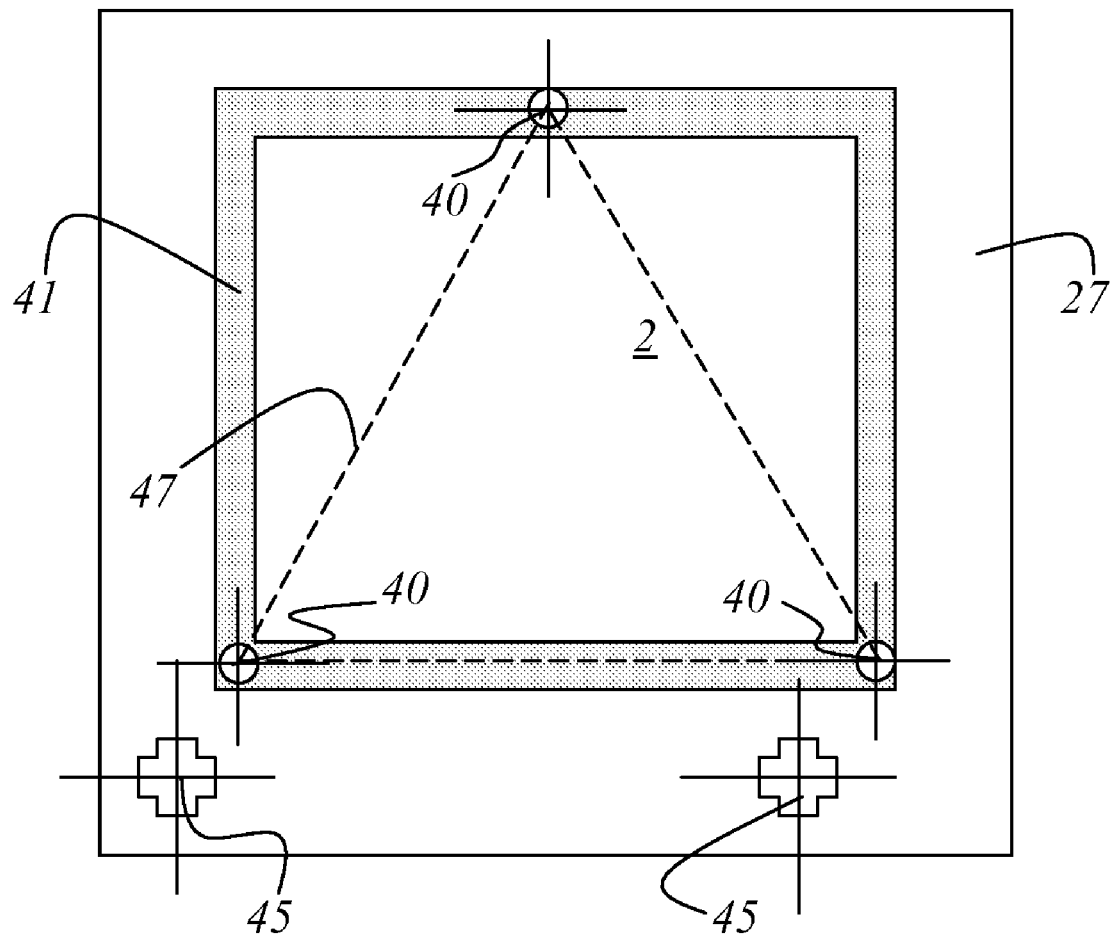
FIG. 3 schematically shows a substrate support in which a substrate is inserted.

FIG. 3 shows a substrate 2 inserted in substrate holder 27. In the embodiment shown here, substrate holder 27 is formed as a frame 41. A plurality of support points 40 are provided on frame 41 of the substrate holder. Substrate 2 is supported on support points 40. The degree of bending of substrate 2 can be calculated with the finite-element method using the knowledge on support points 40. It will be understood by a person skilled in the art that the distribution of support points 40 on frame 41 of substrate holder 27 has a significant influence on the resulting bending of substrate 2. To calculate the degree of bending of substrate 2, it is necessary to know the exact position of support points 40 in relation to a coordinate system. The position of substrate 2 in substrate holder 27 is also essential for calculating the degree of bending. Usually substrates 2 are placed on substrate holder 27 or directly on stage 20 by a robot. As a result each substrate 2 is placed at a slightly different position on substrate holder 27 or measuring stage 20, whereby support points 40 have a different position in relation to the substrate each time. It is therefore also necessary to know the exact position of the substrate with respect to the support points in order to calculate the exact degree of bending of substrate 2. Additionally, substrate support 27 or measuring stage 20 can be provided with further alignment marks 45 which enable the alignment of measuring stage 20 or substrate support 27 with respect to the coordinate system of coordinate measuring machine 1 to be determined. In the embodiment shown here, geometry 47 defined by the support points is a triangle. It goes without saying that other geometries for supporting substrate 2 are also possible.

Figure 4A:
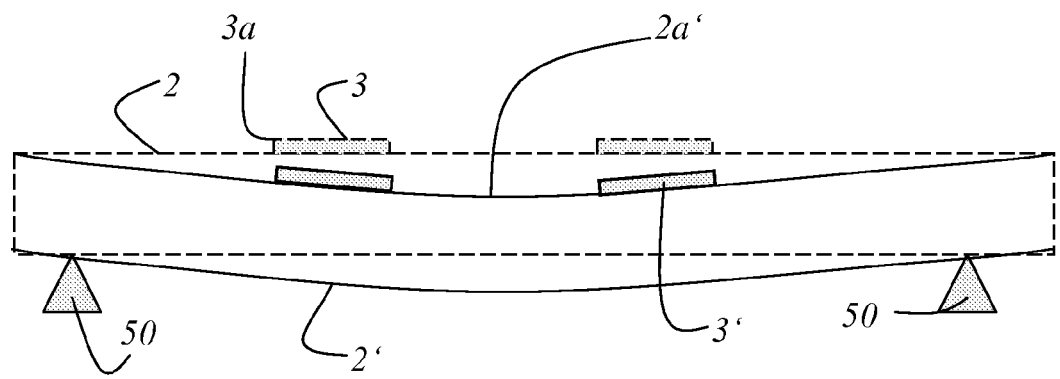
FIG. 4a schematically shows the bending of a substrate, wherein the structures are arranged on the concave side of the bending of the substrate.

FIG. 4a is a schematic view of the bending of substrate 2 when supported on support points 50. Substrate 2 with no bending is depicted in FIG. 4a by broken lines. Structures 3 applied to surface 2a of the substrate are also depicted as broken lines. Bending occurs as a result of the substrate being supported on at least two support points 50. The bent substrate 2' is depicted in FIG. 4a by a solid line. The structures 3' on surface 2a' of the bent substrate are also depicted with solid lines.

Figure 4B:
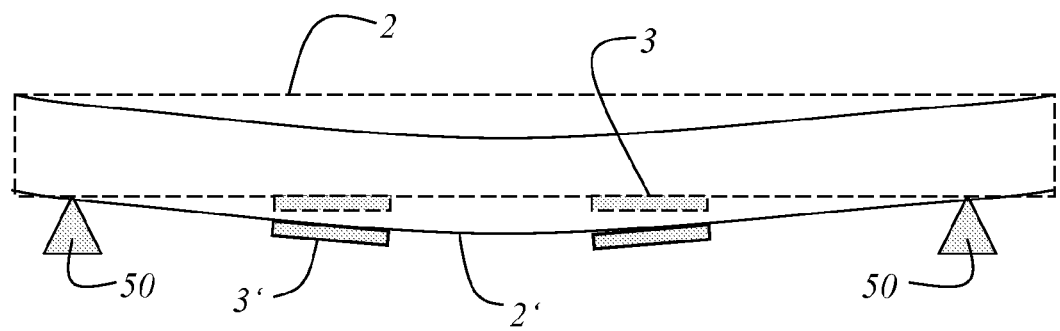
FIG. 4b schematically shows the bending of a substrate, wherein the structures are arranged on the convex side of the bending of the substrate.

FIG. 4b shows a further support arrangement for substrate 2 on support points 50. Again, substrate 2 with no bending is depicted by broken lines. Herein structures 3, and/or 3' are located on surface 2a' of the substrate, which faces support points 50. In other words, the arrangement of substrate 2 on support points 50 corresponds to the arrangement of the substrate as depicted in FIG. 2. Herein the structures face in the direction of the force of gravity.

Figure 5:
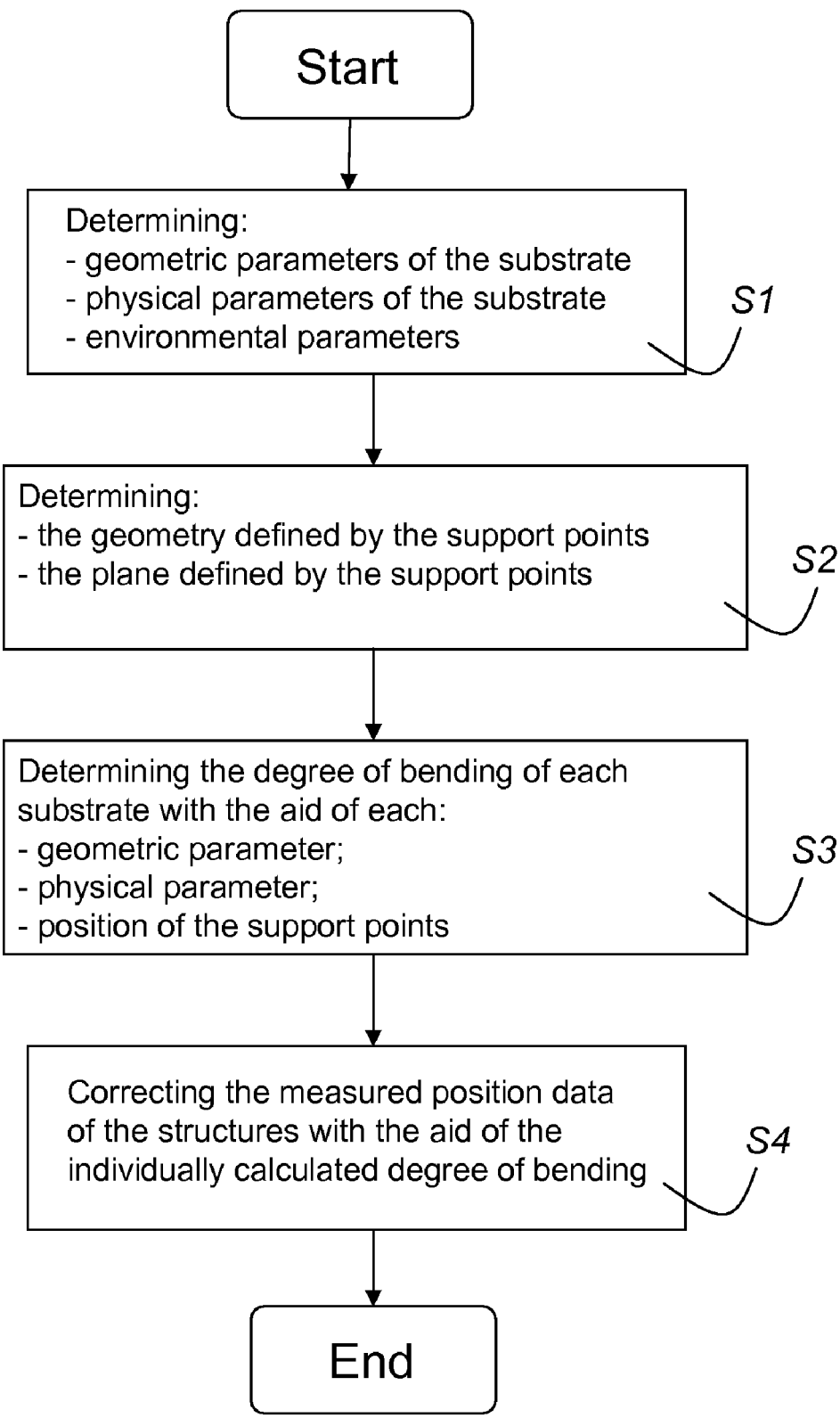
FIG. 5 shows a possible flow chart of the method according to the present invention.

FIG. 5 is a schematic view of a possible flow chart of the method according to the present invention. Initially, in a first step S1, the geometric parameters of substrate 2, the physical parameters of substrate 2 and the environmental parameters prevalent at the installation site of the coordinate measuring machine 1 are determined. In a further step S2, geometry 47 defined by support points 40 is determined. The position of the plane defined by support points 40 is also determined therefrom. Once the necessary information regarding the parameters and the distribution of the support points has been determined, a further step S3 calculates the degree of bending of each substrate 2, placed in either a substrate holder 27 or on measuring stage 20. The calculation uses the geometric parameters, the physical parameters and the positions of the support points. Finally, in step S4, the measured position data of structures 3 is corrected using the individually calculated degree of bending of each substrate 2. The positions of structures 3 are obtained using image analysis. Herein a profile of structure 3 is imaged. The position of each edge of structure 3 in relation to a coordinate system of coordinate measuring machine 1 can be determined from the position of the profile edges in the recorded image. The edge positions of the individual structures are determined by moving each structure 3 to be measured into the beam path of measuring lens 9. The position of measuring stage 20 is determined herefor by means of the interferometer depicted in FIG. 1 and FIG. 2. As already repeatedly mentioned, the measured edge positions of the structures are, however, dependent on the substrate's degree of bending. These measured values of the edge positions of the structures are thus corrected in accordance with the determined bending of the substrates and/or each individual substrate.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for correcting the measured values of positions of structures on a substrate, wherein the correction results from the bending of a substrate, comprising the following steps:
    a) determining at least one geometric parameter of the substrate with a measuring lens arranged moveable in the Z coordinate direction in combination with a detector of a camera;
    b) determining at least one physical parameter of the substrate and at least one environmental parameter;
    c) determining the geometry and a plane defined by support points and obtaining a position of each support point in relation to a coordinate system of the substrate, wherein the determination is carried with the measuring lens moveable in the Z coordinate direction in combination with the detector of the camera;
    d) individually calculating with a computer a degree of bending for each substrate on the basis of the determined geometric parameters, the physical parameters and the positions of the support points; and
    e) correcting the measured position data of the structures on the substrate with the aid of the individually calculated degree of bending.

2. The method according to claim 1, wherein a local thickness of the substrate is determined by means of establishing both the plane defined by the support points and the position of the surface of the substrate supported on the support points, whereby the local thickness of the substrate can be calculated from the local distance between the plane and the surface.

3. The method according to claim 1, wherein the geometric parameters comprise the local thickness and the contour of the substrate.

4. The method according to claim 1, wherein the physical parameters comprise modulus of elasticity and density, and the environmental parameters comprise acceleration due to gravity at a respective installation location of a coordinate measuring machine, air pressure, humidity and temperature.

5. The method according to claim 1, wherein the substrate comprises a plurality of outer edges, wherein the size and the contour of the substrate is obtained on the basis of the position of the edges in relation to a coordinate system determined by the support points.

6. The method according to claim 5, wherein the position of the substrate is determined relative to the coordinate system of the support points.

7. The method according to claim 4, wherein the modulus of elasticity of the substrate being used, is determined from the calculated and measured degree of bending and from the resulting deviation of the lateral positions.

8. The method according to claim 1, wherein a deviation of the obtained parameters from the parameters used for calculating a reference substrate is determined.

9. The method according to claim 1, wherein the degree of bending of the reference substrate is calculated using reference parameters, wherein the reference parameters are selected within a predefined range of tolerance in such a way that a discrete parameter is selected from each tolerance range, and on the basis of the selected parameters the degree of bending of the substrate is calculated with any combination of selected parameters.

10. The method according to claim 9, wherein an interpolation between the calculated values is carried out.

11. The method according to claim 10, wherein a correction of the degree of bending is determined on the basis of the degree of bending calculated for the reference substrate.

12. The method according to claim 10, wherein the calculation of the actual degree of bending of the substrate is carried out for each set of parameters measured.

13. The method according to claim 1, wherein the substrate is a mask for semiconductor manufacture.

* * * * *